United States Patent [19]

Iwasa

[11] Patent Number: 5,530,276

[45] Date of Patent: Jun. 25, 1996

[54] NONVOLATILE SEMICONDUCTOR MEMORY DEVICE

[75] Inventor: Shoichi Iwasa, Tokyo, Japan

[73] Assignee: Nippon Steel Corporation, Tokyo, Japan

[21] Appl. No.: 270,833

[22] Filed: Jul. 5, 1994

Related U.S. Application Data

[63] Continuation-in-part of Ser. No. 183,852, Jan. 21, 1994, Pat. No. 5,381,028.

[30] Foreign Application Priority Data

Jan. 21, 1993 [JP] Japan .................................. 5-027463
Jul. 6, 1993 [JP] Japan .................................. 5-191904

[51] Int. Cl.$^6$ ................................................ H01L 29/792
[52] U.S. Cl. .......................... 257/324; 257/382; 257/327
[58] Field of Search .................................. 257/324, 382, 257/327; 437/162; 365/184

[56] References Cited

U.S. PATENT DOCUMENTS 5,045,901 9/1991 Komori et al. ........................ 257/389
5,171,698 12/1992 Shimoda .............................. 437/162

FOREIGN PATENT DOCUMENTS 52-47687 4/1977 Japan ..................................... 437/162
60-226183 11/1985 Japan ..................................... 257/324

OTHER PUBLICATIONS

New Scaling Guidelines for NMOS Nonvolatile Memory Devices, S. Minami et al., IEEE Transactions on Electron Devices vol. 38, No. 11, Nov. 1991.

*Primary Examiner*—Robert P. Limanek
*Attorney, Agent, or Firm*—Pollock, Vande Sande & Priddy

[57] ABSTRACT

A nonvolatile semiconductor memory device comprises: a semiconductor substrate; a pair of spaced electrode films formed on a surface of the semiconductor substrate and having respective side faces opposing each other with a gap formed between them; a pair of diffusion layers formed in the surface of the semiconductor substrate and having respective end portions aligned with the side faces of the electrode films; an insulating film covering the gap and the spaced electrode films; a gate electrode formed on the insulating film to cover the gap and to extend above the pair of electrode films; and wiring layers directly connected to the pair of electrode films, respectively.

4 Claims, 4 Drawing Sheets

NONVOLATILE SEMICONDUCTOR MEMORY DEVICE

CROSS-REFERENCE TO THE RELATED APPLICATION

This application is a continuation-in-part of U.S. patent application Ser. No. 08/183,852 filed Jan. 21, 1994, now U.S. Pat. No. 5,381,028 contents of which are incorporated herein by reference.

BACKGROUND OF THE INVENTION

1. Field of the Invention

The present invention relates to a nonvolatile semiconductor memory device such as MNOS (Metal Nitride Oxide Semiconductor) type EEPROM (Electrically Erasable and Programable Read Only Memory) and a method of manufacturing the same.

2. Description of the Related Art

The MNOS type EEPROM has a gate insulating film which has a thickness of about 2 to 3 nm and serves as a tunnel film formed under a gate electrode of an ordinary transistor; and a silicon nitride film formed on the gate insulating film.

A nonvolatile semiconductor memory device having a conventional, general MNOS type EEPROM structure as disclosed, for example, in "New Scaling Guidelines for MNOS Nonvolatile Memory Devices" by S. Minami et al., IEEE Transactions on Electron Devices, Vol. 38, No. 11, November, 1991, will be described below with reference to FIG. 10.

In FIG. 10, a memory cell of the nonvolatile semiconductor memory device has a first insulating film 3 formed on a P-type semiconductor substrate 1 to form a first gate insulating film in an active region separated by an element separation insulating films 2 formed on the P-type semiconductor substrate 1; N-type diffusion layer 9 which is formed in the P-type semiconductor substrate 1 on the opposite sides of the first insulating film 3; a silicon nitride film 6 formed on the first insulating film 3; a second gate insulating film 5 formed on the silicon nitride film 6; and an N-type polysilicon layer 8 formed on the second gate insulating film 5.

FIG. 11 shows a circuit equivalent to the memory cell. In FIG. 11, the reference numeral 18 designates a charge storage layer formed of the silicon nitride film 6; 21 is a source; 22 a drain; C1 a capacitance between the P-type semiconductor substrate 1 and the charge storage layer 18; C2 a capacitance between the N-type polysilicon layer 8 and the charge storage layer 18; and C3 a capacitance between the source 21 or drain 22 and the charge storage layer 18.

In the conventional nonvolatile semiconductor memory device, the silicon nitride film 6 is made thinner with miniaturization of the device and lowering of the program voltage, resulting in degradation of the retention characteristic of the silicon nitride film 6. As a countermeasure, the second insulating film 5 is formed on the silicon nitride film 6.

The writing and erasing operations of the conventional MNOS type EEPROM shown in FIG. 10 are carried out by transferring electrons between the P-type semiconductor substrate 1 and the silicon nitride film 6 through the whole region of the first gate insulating film 3. Accordingly, the writing and erasing efficiency becomes greater as the electron transmission region of the first gate insulating film 3 is made smaller.

In the nonvolatile semiconductor memory device having the Conventional MNOS type EEPROM structure as shown in FIG. 10, however, the gate length depends on processing accuracy in photolithography technique, so that the gate length is determined on the basis of the width of the first gate insulating film 3. Further, like in the case of a conventional MOS FET, the minimum gate length which causes a leak current is determined depending on the junction depth of the source/drain diffusion layers. Accordingly, the miniaturization of the nonvolatile memory device has a limit determined by the processing accuracy in photolithography technique and the junction depth of the source/drain diffusion layers.

SUMMARY OF THE INVENTION

An object of the present invention is therefore to provide a nonvolatile semiconductor memory device having a pair of separated impurity diffusion layers formed on a semiconductor substrate, in which the junction depth of each of the impurity diffusion layers is small and at the same time the channel length therebetween is small so that the nonvolatile semiconductor device has a structure adapted to allow miniaturization of the device.

Another object of the present invention is to provide a method of manufacturing a nonvolatile semiconductor memory device as mentioned above.

The nonvolatile semiconductor memory device according to one aspect of the present invention comprises: a semiconductor substrate of a first conductivity type and a pair of spaced polycrystalline silicon films including impurities of a second conductivity type different from the first conductivity type and formed on a surface of the semiconductor substrate with a gap therebetween. A pair of diffusion layers of the second conductivity type is formed by diffusing, from the pair of polycrystalline silicon films, the impurities included therein into the semiconductor substrate, respectively and a first gate insulating film is provided including at least two layers and covering a region of the semiconductor substrate corresponding to the gap between the pair of polycrystalline silicon films. Also a conductive film is formed on the first gate insulating film.

The nonvolatile semiconductor memory device according to another aspect of the present invention comprises a semiconductor substrate of a first conductivity type and a pair of spaced polycrystalline silicon films including impurities of a second conductivity type different from the first conductivity type and formed on a surface of the semiconductor substrate with a gap therebetween. A pair of diffusion layers of the second conductivity type is formed by diffusing, from the pair of polycrystalline silicon films:, the impurities included therein into the semiconductor substrate, respectively. A first gate insulating film is provided including at least two layers and covering a region of the semiconductor substrate corresponding to the gap between the pair of polycrystalline silicon films. A second gate insulating film including at least one silicon oxide film layer is formed on the first gate insulating film and a conductive film is formed on the second gate insulating film.

The nonvolatile semiconductor memory device according to a further aspect of the present invention comprises a semiconductor substrate of a first conductivity type and a pair of spaced polycrystalline silicon films including impurities of a second conductivity type different from the first conductivity type and formed on a surface of the semiconductor substrate with a gap therebetween. A pair of diffusion layers of the second conductivity type is formed by diffusing, from the pair of polycrystalline silicon films, the impurities included therein into the semiconductor substrate, respectively. A first gate insulating film including at least two layers is formed on a surface region of the semiconductor substrate which is exposed at the gap between the pair of polycrystalline silicon films and side wall insulating films are formed respectively on side walls of the pair of polycrystalline silicon films adjacent to the gap, respectively. And second gate insulating film including at least one silicon oxide film layer and formed on the first gate insulating film and a conductive film formed on the second gate insulating film.

The nonvolatile semiconductor memory device according to a still further aspect of the present invention comprises a semiconductor substrate of a first conductivity type and a pair of spaced polycrystalline silicon films including impurities of a second conductivity type different from the first conductivity type and formed on a surface of the semiconductor substrate with a gap therebetween. A pair of diffusion layers of the second conductivity type is formed by diffusing, from the pair of polycrystalline silicon films, the impurities included therein into the semiconductor substrate, respectively. A first gate insulating film including at least two layers is formed on a surface region of the semiconductor substrate which is exposed at the gap between the pair of polycrystalline silicon films and side wall insulating films are formed respectively on side walls of the pair of polycrystalline silicon films adjacent to the gap, respectively. Also, a conductive film formed on the first gate insulating film.

In a preferred embodiment of the nonvolatile semiconductor memory device according to the present invention, the first insulating film includes a silicon oxide film, and a silicon nitride film formed on the silicon oxide film.

The method of manufacturing a nonvolatile semiconductor memory device according to one aspect of the present invention comprises the steps of: forming, on a surface of a semiconductor substrate of a first conductivity type, a polycrystalline silicon film including impurities of a second conductivity type different from the first conductivity type; etching the polycrystalline silicon film selectively so as to form a pair of spaced polycrystalline silicon films with a small gap therebetween on the surface of the semiconductor substrate; diffusing the impurities of the second conductivity type included in the pair of polycrystalline silicon films into the surface of the semiconductor substrate to thereby form a pair of diffusion layers of the second conductivity type; forming a first insulating film on a region of the surface of the semiconductor substrate which is exposed at the small gap; forming a silicon nitride film on the first insulating film; and forming a conductive film on the silicon nitride film.

The method of manufacturing a nonvolatile semiconductor memory device according to another aspect of the present invention comprises the steps of: forming, on a surface of a semiconductor substrate of a first conductivity type, a polycrystalline silicon film including impurities of a second conductivity type different from the first conductivity type; etching the polycrystalline silicon film selectively so as to form a pair of spaced polycrystalline silicon films with a small gap therebetween on the surface of the semiconductor substrate; diffusing the impurities of the second conductivity type included in the pair of polycrystalline silicon films into the surface of the semiconductor substrate to thereby form a pair of diffusion layers of the second conductivity type; forming a first insulating film on a region of the surface of the semiconductor substrate which is exposed at the small gap; forming a second insulating film including a silicon nitride film on the first insulating film; forming a third insulating film on the silicon nitride film by thermal oxidation of the silicon nitride film; and forming a conductive film on the third insulating film.

The method of manufacturing a nonvolatile semiconductor memory device according to a further aspect of the present invention comprises the steps of: forming, on a surface of a semiconductor substrate of a first conductivity type, a polycrystalline silicon film including impurities of a second conductivity type different from the first conductivity type; etching the polycrystalline silicon film selectively so as to form a pair of spaced polycrystalline silicon films with a small gap therebetween on the surface of the semiconductor substrate; diffusing the impurities of the second conductivity type included in the pair of polycrystalline silicon films into the surface of the semiconductor substrate to thereby form a pair of diffusion layers of the second conductivity type; forming a first insulating film on a region of the surface of the semiconductor substrate which is exposed at the small gap; forming a second insulating film to cover the first insulating film and at least portions of the pair of polycrystalline silicon films adjacent to the region of the surface of the semiconductor substrate; applying to the second insulating film an anisotropic etching to thereby form side wall insulating films, respectively, on side walls of the pair of polycrystalline silicon films adjacent to the region of the surface of the semiconductor substrate, respectively; forming a silicon nitride film to cover the first insulating film and the side wall insulating films; and forming a conductive film on the silicon nitride film.

The method of manufacturing a nonvolatile semiconductor memory device according to a still further aspect of the present invention comprises the steps of: forming, on a surface of a semiconductor substrate of a first conductivity type, a polycrystalline silicon film including impurities of a second conductivity type different from the first conductivity type; etching the polycrystalline silicon film selectively so as to form a pair of spaced polycrystalline silicon films with a small gap therebetween on the surface of the semiconductor substrate; diffusing the impurities of the second conductivity type included in the pair of polycrystalline silicon films into the surface of the semiconductor substrate to thereby form a pair of diffusion layers of the second conductivity type; forming a first insulating film on a region of the surface of the semiconductor substrate which is exposed at the small gap; forming a second insulating film to cover the first insulating film and at least portions of the pair of polycrystalline silicon films adjacent to the region of the surface of the semiconductor substrate; applying to the second insulating film an anisotropic etching to thereby form a pair of side wall insulating films on side walls of the pair of polycrystalline silicon films adjacent to the region of the surface of the semiconductor substrate, respectively; forming a silicon nitride film to cover the first insulating film and the side wall insulating films; forming a fourth insulating film on the silicon nitride film by thermal oxidation of the silicon nitride film; and forming a conductive film on the fourth insulating film.

According to the present invention, impurities in polycrystalline silicon films are diffused into a semiconductor substrate of a first conductivity type by thermal treatment to form the diffusion layers of a second conductivity type. Accordingly, the junction can be formed at very small depth without any crystal defect as compared with the method of forming the diffusion layers of the second conductivity type by introducing impurities by ion implantation into the semiconductor substrate of the first conductivity type. As a result, the gate length of the nonvolatile semiconductor memory device can be shortened, and the miniaturization thereof can be attained.

Further, the small gap (for example, the gap can be set to a value of from 0.2 to 0.3 μm in photography technique by using a phase shifting method or the like) between the pair of polycrystalline silicon layers of the second conductivity type directly serves as the channel length, so that the region of the gate insulating film is reduced. Accordingly, the writing and erasing efficiency is improved.

DESCRIPTION OF THE PREFERRED EMBODIMENTS

Figure 10:
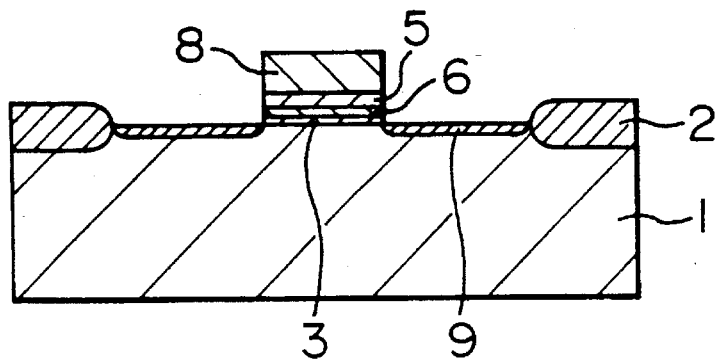
FIG. 10 is a sectional view showing the structure of a conventional nonvolatile semiconductor memory device having an MNOS type EEPROM structure.
Figure 11:
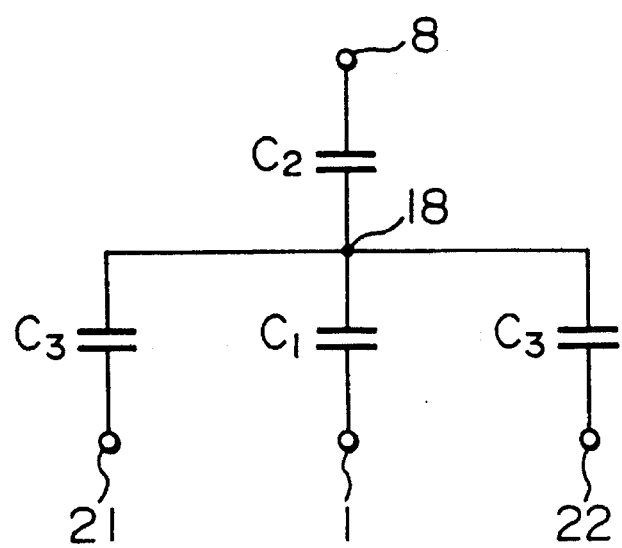
FIG. 11 is a diagram of a circuit equivalent of the memory cell forming the nonvolatile semiconductor memory device.

Referring to FIGS. 1 through 7, a first embodiment of a nonvolatile semiconductor memory device according to the present invention will be described below. In this embodiment shown in FIGS. 1 through 7, parts corresponding to those in the conventional example shown in FIG. 10 are designated by the same reference numerals.

Figure 1:
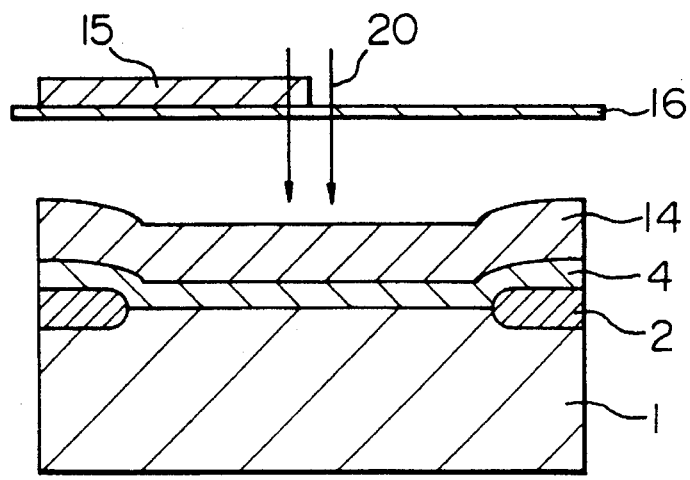
FIGS. 1 to 7 are sectional views of a memory cell constituting a nonvolatile semiconductor memory device having an SONOS structure, at the respective steps in the method of producing the nonvolatile semiconductor memory device according to a first embodiment of the present invention.

As shown in FIG. 1, an element isolation insulating film 2 is formed on a P-type semiconductor substrate 1 by a local oxidation of silicon (LOCOS) method to thereby determine an active region. Next, a first polycrystalline silicon film 4 including N-type impurities is deposited on the P-type semiconductor substrate 1 by a chemical vapor deposition (CVD) method, and a photoresist 14 is formed thereon. Next, ultraviolet rays 20 are radiated onto the P-type semiconductor substrate 1 through a quartz mask 16 having a phase shifter 15 deposited thereon to thereby perform exposure of the photoresist 14. By this exposure, a small gap region (slit) with a width of about 0.2 μm or less is formed at a portion of the photoresist 14 on the P-type semiconductor substrate 1 corresponding to the edge of the phase shifter 15.

Figure 2:
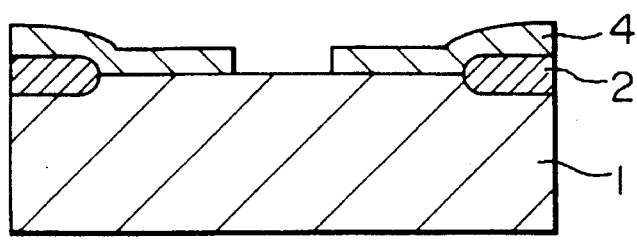

Next, as shown in FIG. 2, the first polycrystalline silicon film 4 including N-type impurities is patterned by anisotropic dry etching using as a mask the photoresist 14 having the small gap region formed therein.

Figure 3:
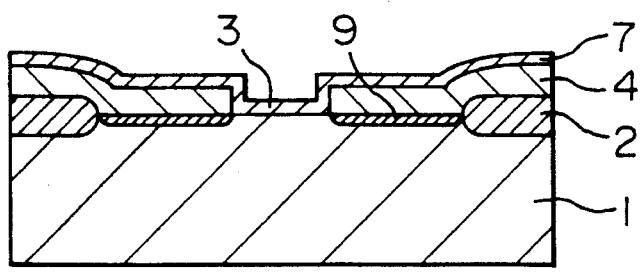

Next, as shown in FIG. 3, a first insulating film 3 providing a first gate insulating film and interlayer insulating films 7 is formed of a thermally oxidized silicon layer with a thickness of about 20 Å on the N-type first polycrystalline silicon layers 4 and a portion of the P-type semiconductor substrate 1 exposed to the small gap region. By thermal treatment for thermal oxidation at this time or by a succeeding high-temperature annealing process, the N-type impurities in the N-type first polycrystalline silicon layers 4 are diffused into the P-type semiconductor substrate 1 through the contacts between them so that N-type diffusion layers 9 with a small junction depth of about 0.05 μm are obtained.

Figure 4:
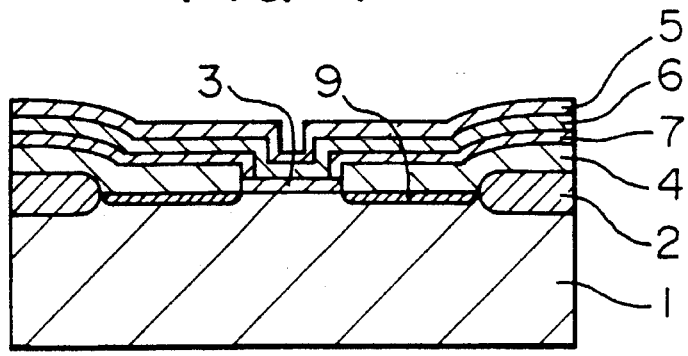

Next, as shown in FIG. 4, a silicon nitride film 6 is deposited on the P-type semiconductor substrate 1 by a CVD method and subjected to thermal oxidation to form a second gate insulating film 5.

Figure 5:
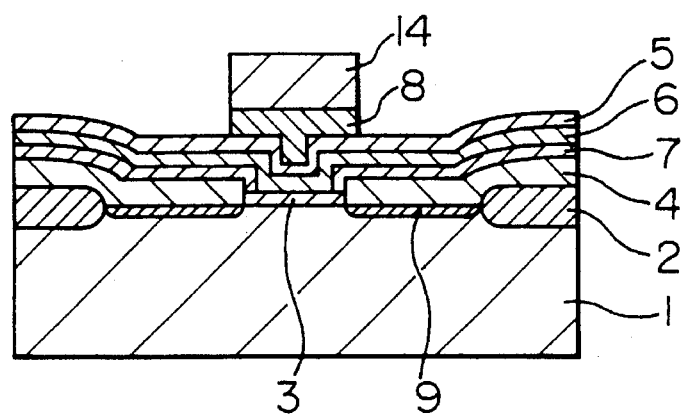

Next, an N-type second polycrystalline silicon film 8 is deposited on the second gate insulating film 5 by a CVD method, and a photoresist 14 is formed thereon. Next, exposure of the photoresist 14 is carried out by radiation of ultraviolet rays through a quartz mask having a phase shifter (not shown), so that the photoresist 14 is patterned as shown in FIG. 5. The N-type second polycrystalline silicon film 8 is patterned anisotropic dry etching by using the photoresist 14 as a mask.

Figure 6:
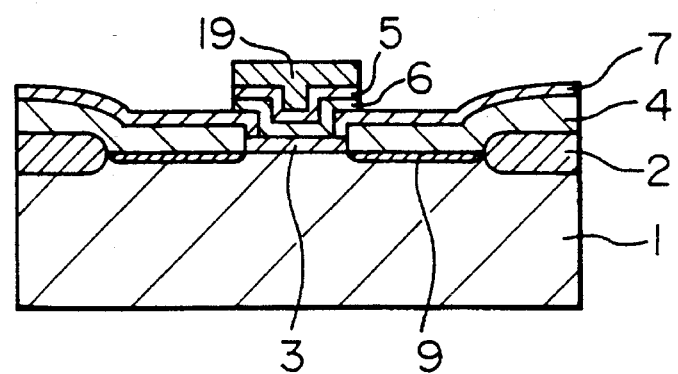

Next, as shown in FIG. 6, using as a mask the thus patterned N-type second polycrystalline silicon film 8, the second gate insulating film 5 and the silicon nitride film 6 under the second polycrystalline silicon film 8 are patterned by anisotropic dry etching. As a result, the N-type second polycrystalline silicon film 8 is formed as a gate electrode 19.

Figure 7:
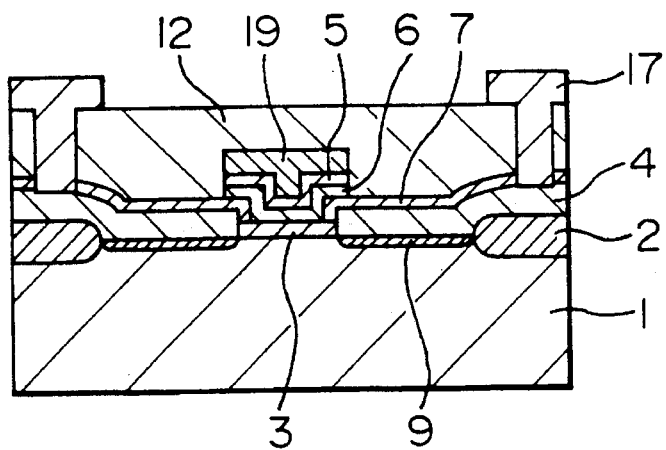

Next, as shown in FIG. 7, an interwiring insulating film 12 is formed on the whole surface by a CVD method and then an opening is formed through the interwiring insulating film 12 and the interlayer insulating film 7. Thereafter, an aluminum electrode 17 is formed in the opening to be in contact with the N-type first polycrystalline silicon film 4.

Figure 8:
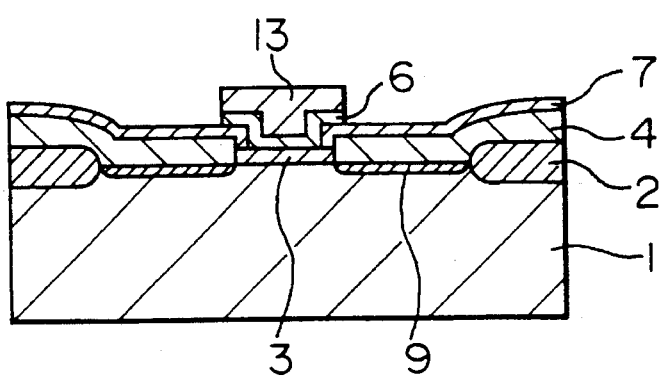
FIG. 8 is a sectional view showing the structure of a nonvolatile semiconductor memory device having an SONOS structure according to another embodiment of the present invention.

Referring to FIG. 8, a second embodiment of the nonvolatile semiconductor memory device according to the present invention will be described below. In the embodiment shown in FIG. 8, parts corresponding to those in the first embodiment shown in FIGS. 1 through 7 are designated by the same reference numerals.

After the same steps as the steps shown in FIGS. 1 to 3 in the first embodiment are carried out, a silicon nitride film 6 is deposited in a thickness of 300 to 500 Å on the whole surface by a CVD method and then an aluminum film is deposited thereon. Next, the silicon nitride film 6 and the aluminum film are patterned to form an aluminum electrode 13 on the silicon nitride film 6. By the aforementioned method, a nonvolatile semiconductor memory device having an MNOS structure as shown in FIG. 8 is obtained.

Figure 9:
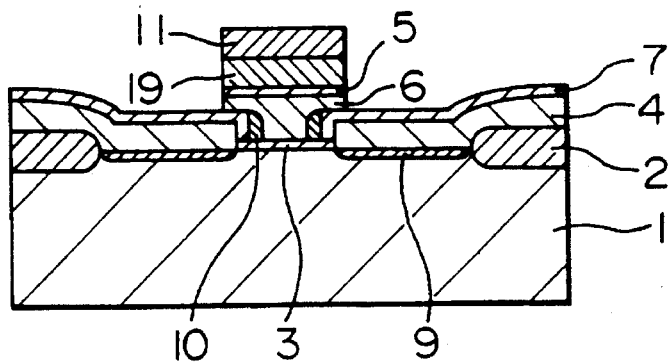
FIG. 9 is a sectional view showing the structure of a nonvolatile semiconductor memory device having an SONOS structure according to a further embodiment of the present invention.

Referring to FIG. 9, a third embodiment of the nonvolatile semiconductor memory device according to the present invention will be described below. In the embodiment shown in FIG. 9, parts corresponding to those in the first embodiment shown in FIGS. 1 through 7 are designated by the same reference numerals.

After the same steps as those shown in FIGS. 1 through 3 in the first embodiment are carried out, a silicon oxide film is deposited having a thickness of 1500 to 2000 Å on the whole surface by a CVD method and etched anisotropically by an RIE method so as to form side wall insulating films 10 on side walls of the N-type first polycrystalline silicon films 4, between which the small gap is formed.

Next, a silicon nitride film 6 is deposited having a thickness of 300 to 500 Å by the CVD method on the whole surface and subjected to thermal oxidation to form a second gate insulating film 5.

Next, an N-type second polycrystalline silicon film providing a gate electrode 19 is formed on the second gate insulating film 5 and then silicide ($M_xSi_y$) 11 is formed thereon having a thickness of 1500 Å or less.

Next, a photoresist is formed on the silicide 11 and then exposure of the photoresist is carried out for patterning the photoresist by radiation of ultraviolet rays through a quartz mask having a phase shifter deposited thereon (not shown). By using the photoresist as a mask, the silicide 11 and the N-type second polycrystalline silicon film are patterned by anisotropic dry etching to provide a lower half of the gate electrode 19.

Next, using the thus patterned gate electrode 19 as a mask, the second gate insulating film 5 and the silicon nitride film 6 under the gate electrode 19 are patterned by anisotropic dry etching. By this method, a nonvolatile semiconductor memory device having an SONOS structure and having side wall insulating films as shown in FIG. 9 is obtained.

In this type of EEPROM, the gate length thereof depends on the accuracy in photolithography technique and is determined by the width of the first gate insulating film 3. Further, the minimum gate length which causes a leak current is determined depending on the junction depth of each of the source/drain diffusion layers. In the present invention, a structure in which the junction depth of each of the source/drain diffusion layers is smaller than that in the conventional structure can be easily obtained. Further, the gap length between the pair of polycrystalline silicon layers can be reduced to about 0.2 to 0.3 µm with photolithography technique such as, for example, a phase shifting method or the like. Because the small gap length directly provides the channel length so that the region of the gate insulating film is reduced, the writing and erasing efficiency is improved.

Although the present invention has been described in connection with the above embodiments thereof, it will be appreciated that it is not limited to the aforementioned embodiments and that various useful modifications may be made without deviating from the technical way of the present invention. For example, though in the above description N-type diffusion layers 9 are formed from N-type first polycrystalline silicon film 4 formed on a P-type semiconductor substrate 1, the invention can be applied to the case where P-type diffusion layers are formed from P-type polycrystalline silicon film formed on an N-type semiconductor substrate.

In the nonvolatile semiconductor memory device and the method of producing the same according to the present invention, impurity diffusion layers (source/drain diffusion layers) each having a junction depth smaller than that in the conventional nonvolatile semiconductor memory device can be formed, so that the tunnel window can be reduced as compared with the conventional device. Accordingly, not only the memory cell can be miniaturized but also the writing and erasing efficiency can be improved.

What is claimed is:

1. A non-volatile semiconductor memory device comprising:

a semiconductor substrate;

a pair of spaced electrode films formed on a surface of said semiconductor substrate and having respective side faces opposite each other with a gap formed therebetween;

a pair of diffusion layers formed in the surface of said semiconductor substrate and having respective end portions aligned with said side faces of said electrode films;

a first insulating film covering said gap and said spaced electrode films;

a silicon nitride film formed on said first insulating film to cover at least said gap;

a second insulating film formed on said silicon nitride film to cover at least said gap;

a gate electrode formed on said second insulating film to cover at least said gap; and conductive layers directly connected to said pair of electrode films.

2. A non-volatile semiconductor memory device according to claim 1, wherein each of said first and second insulating films includes a silicon oxide film.

3. A non-volatile semiconductor memory device comprising:

a semiconductor substrate;

a pair of spaced electrode films formed on a surface of said semiconductor substrate and having respective side faces opposite each other with a gap formed therebetween;

a pair of diffusion layers formed in the surface of said semiconductor substrate and having respective end portions aligned with said side faces of said electrode films;

a first insulating film covering said gap and said spaced electrode films;

sidewall insulating films formed in said gap to cover said side faces of said electrode films;

a silicon nitride film formed on said first insulating film to cover at least said gap;

a second insulating film formed on said silicon nitride film to cover at least said gap;

a gate electrode formed on said second insulating film to cover at least said gap; and conductive layers directly connected to said pair of electrode films.

4. A non-volatile semiconductor memory device according to claim 3, wherein each of said first and second insulating films includes a silicon oxide film.

* * * * *